United States Patent
Liu (10) Patent No.: US 7,133,311 B2
(45) Date of Patent: Nov. 7, 2006

(54) LOW POWER, HIGH SPEED READ METHOD FOR A MULTI-LEVEL CELL DRAM

(75) Inventor: Bo Liu, 850 Belmont St. Apt 201, Boise, ID (US) 83706

(73) Assignee: Bo Liu, Pocafello, ID (US)

( * ) Notice: Subject to any disclaimer, the term of this patent is extended or adjusted under 35 U.S.C. 154(b) by 0 days.

(21) Appl. No.: 11/203,383

(22) Filed: Aug. 12, 2005

(65) Prior Publication Data
US 2006/0034130 A1 Feb. 16, 2006

Related U.S. Application Data

(60) Provisional application No. 60/601,819, filed on Aug. 16, 2004.

(51) Int. Cl.
*G11C 11/54* (2006.01)
*G11C 7/02* (2006.01)

(52) U.S. Cl. ...................... 365/168; 365/207
(58) Field of Classification Search ............... 365/168, 365/149, 189.02, 207
See application file for complete search history.

(56) References Cited

U.S. PATENT DOCUMENTS

| 5,283,761 | A | * | 2/1994 | Gillingham | 365/189.07 |
| 5,539,695 | A | * | 7/1996 | Saito et al. | 365/189.09 |
| 5,684,736 | A | * | 11/1997 | Chan | 365/149 |
| 5,771,187 | A | * | 6/1998 | Kapoor | 365/149 |
| 5,841,695 | A | * | 11/1998 | Wik | 365/185.08 |
| 5,917,748 | A | * | 6/1999 | Chi et al. | 365/168 |
| 6,556,469 | B1 | * | 4/2003 | Birk et al. | 365/149 |
| 6,654,280 | B1 | * | 11/2003 | Blodgett | 365/185.03 |

* cited by examiner

*Primary Examiner*—Anh Phung (57) ABSTRACT

A method of storing, sensing and restoring three voltage levels (1.5 bit per cell) of a plurality of memory cells in Dynamic random access memory is disclosed. An asymmetrical sense amplifier, ASA, together with a 2 to 2 multiplex, will be used to detect the voltage difference on the bit lines and transfer the voltage difference to digital data. ASA is designed to have one input stronger than the other input. The multiplex is controlled by a signal so that the connection between bit line pair and two inputs of ASA is switched at different time and logical address. Other transistors and circuits are also used to store and restore the voltage levels into memory cells. Coding algorithms are used to get fast read speed of this multi-level cell DRAM.

3 Claims, 8 Drawing Sheets

FIG.1

PRIOR ART

Data read from a single memory cell

| One possible Memory Address | Possible output data of a single memory cell that stores 3 voltage levels | | |
|---|---|---|---|
| | 0 | Vcc/2 | Vcc |
| First sense  Addr<0>=0 | 1'b1 | 1'b0 | 1'b0 |
| Second sense  Addr<0>=1 | 1'b0 | 1'b0 | 1'b1 |

FIG.8A

A 2 to 3 coding algorithm for a 3 level DRAM
'x' refers to either '0' or '1'

| | Original Data | Coded data, first bit is the additional coding bit |
|---|---|---|
| Addr0=0 | 2'b00 | 1'b0, 2'b00 |
| Addr0=1 | 2'bxx | 1'b0, 2'bxx |
| Addr0=0 | 2'b01 | 1'b0, 2'b01 |
| Addr0=1 | 2'bx0 | 1'b0, 2'bx0 |
| Addr0=0 | 2'b01 | 1'b0, 2'b01 |
| Addr0=1 | 2'bx1 | 1'b1, 2'bx0 |
| Addr0=0 | 2'b10 | 1'b0, 2'b10 |
| Addr0=1 | 2'b0x | 1'b0, 2'b0x |
| Addr0=0 | 2'b10 | 1'b0, 2'b10 |
| Addr0=1 | 2'b1x | 1'b1, 2'b0x |
| Addr0=0 | 2'b11 | 1'b1, 2'b00 |
| Addr0=1 | 2'bxx | 1'b0, 2'bxx |

FIG.8B

LOW POWER, HIGH SPEED READ METHOD FOR A MULTI-LEVEL CELL DRAM

CROSS-REFERENCE TO RELATED APPLICATION

Claim the benefit of one prior filed copending provisional application. application Ser. No. 60/601,819 Filed Date: Aug. 16, 2004 Inventor: BO LIU

STATEMENT REGARDING FEDERALLY SPONSORED RESEARCH OR DEVELOPMENT

Not Applicable

REFERENCE TO SEQUENCE LISTING, A TABLE OR A COMPUTER PROGRAM LISTING COMPACT DISK APPENDIX

Not Applicable

BACKGROUND OF THE INVENTION

This invention relates generally to memory devices and particularly to dynamic random memory device with multilevel memory cells. A multi-level cell DRAM can store more than two voltage levels in the memory and thus can store more than 1 bit per cell. Although store four voltage levels in memory cells can achieve more density efficiency, in practice store three-level voltage in memory cells is easier due to the noise margin problem in multi-level DRAM.

Suggested Classification: 365/149; 365/189; 365/168; 365/94

Figure 1:
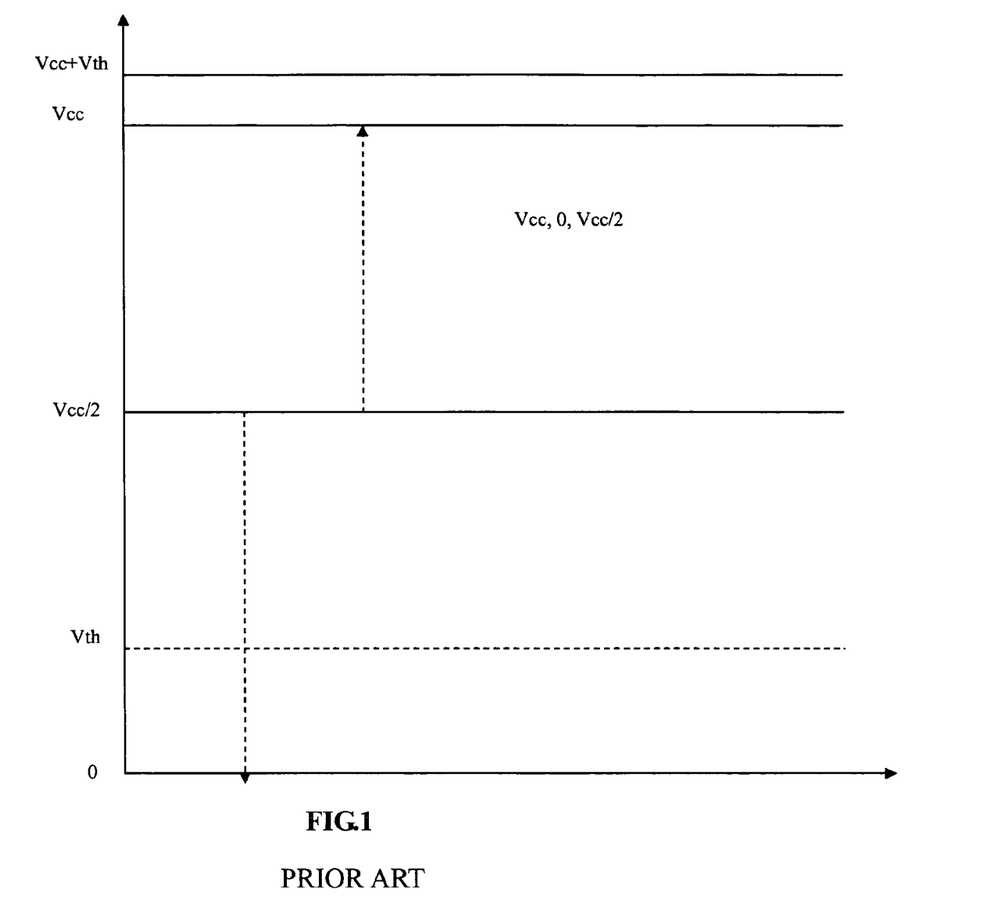
FIG. 1 is a diagram illustrating the storage voltages for a three-level DRAM.

T. Furuyama et al ("Furuyama") in an article titled "An Experimental Two Bit/Cell storage DRAM for Macro Cell or Memory on Logic Application", IEEE J. Solid State Circuits, volume 24, number 2, page 388 to 393, April 1989 proposed one multilevel sense and restore method. In this scheme, four voltages stored in the memory and mapped to two bits, as shown in FIG. 1. For sense operation, cell charge share with bit line and bit line is split into three sub bit lines and then isolated from one another via switches. These three sub bit lines will be connected to three sense amplifier SA, SA compare three sub bit lines with three reference voltages and output corresponding 2 bit data. This method can read 2 bit data out at one time and fast, but the disadvantage of this scheme is also very obvious that it need three sense amplifiers, more switches and control circuit for sub bit line and a worst disadvantage is that it's susceptibility to sense errors with unstable globe reference voltage and small noise margin. And even this scheme is faster comparing to the following scheme, it still need more switching operations and decoding operations, these operation make this scheme still slower than most conventional DRAM.

U.S. Pat. No. 5,283,761 to Gillingham discloses the method and circuit to form two pairs of sub bit lines, with each pair having a sense amplifier, unlike the parallel sensing in the Furuyama scheme, the Gillingham scheme uses sequential sensing. In sequential sensing, the result of the first sense amplifier is used to generate the reference for the second sensing operation. An initial sensing operation compares the multi-level cell voltage to VDD/2 and if cell voltage above VDD/2 then the second sensing operation will compare cell voltage (after charge share with bit line) to a voltage reference of 5VDD/6. Conversely, if the first operation reveals cell voltage below VDD/2, the second operation will compare cell voltage with a voltage reference of VDD/6. The results of the two sensing operations produce 2 bit data. This scheme uses a local generation of reference voltage and therefore can reduce some noise from globe reference voltage use in Furayama. The disadvantage of this scheme is that it still use 2 sense amplifier and has lots of control and switches circuit for sub bit line concept, it also has the problem of much low noise margin compare to conventional DRAM because needs more reference voltage levels. Furthermore, the speed is even slower than Furuyama's scheme.

U.S. Pat. No. 6,556,469 to Birk et al. discloses the method to combine the benefits of Furayama's parallel sensing and Gillingham's using of local reference voltage. Nevertheless, this scheme is limited by the prior scheme's low noise margin problem of multi-level DRAM.

U.S. Pat. No. 6,654,280 to Blodgett discloses the method to decode a two bit, 3-level memory cell to a three bit, 2-level memory cell. The nine possible states of the two cells are mapped into eight data states representing three binary data bits, and one spare state. The ninth state, State 8, is a spare state. The spare state may be used as an erased or unwritten state, or as an error state (data is invalid). This scheme can achieve 66% (⅔) memory array efficiency. The disadvantage for this scheme is that it has to read out the data (0 or 1 or 2) before it can do the decoding. For multi-level memory it needs more time to read out the data than conventional 2-level memory since more operations are need to determine the stored voltage level. Therefore the memory sense speed of this method will be slower than the conventional 2-level DRAM.

BRIEF SUMMARY OF THE INVENTION

In the present invention, a method has been designed, which has the benefits of using conventional reference voltage levels, increasing the speed of multi-level DRAM and also decreasing the power consumption of DRAM, specially for a three level DRAM.

Three different voltages can be stored in a memory cell: 0, Vcc/2 and Vcc. The present invention does not need any special reference voltage levels, but only 0, Vcc/2 and Vcc, which are used in the conventional two levels DRAM.

Every memory cell has two logical addresses. In two serial read operations, two different data can be read out from the same physical address memory cells. A fast read operation can be achieved because the first level data can be used after the first read operation and the second read operation can generate a different data and can be used after the second read operation.

In a read or refresh operation, first, bit lines are pre-charged to Vcc/2, then raise the word line voltage, the bit line voltage level maybe increase, decrease or unchanged depending on the stored cell voltage.

An asymmetrical sense amplifier (ASA) is used to detect whether a 0 voltage is stored or other two voltage levels are stored. The ASA has two inputs In+ and In−, only when In+ is at least some voltage level higher than In−, ASA will output a "1". The design of ASA is to make the input In− has some advantage over input In+, which means unless In+ is some voltage level higher than In−, the ASA will always outputs a "0".

A signal controls a multiplex between a bit line pair and inputs of ASA, in such way, at the first sense operation, the accessed bit line connected to In− and reference bit line connected to In+, at the second sense operation, the connections reverse, so the accessed bit line connected to In+ and reference bit line connected to In−.

The first sense operation happens before word line voltage rise up to Vccp but after word line reaches to Vcc/2. If memory cell stored a 0 voltage, ASA outputs a "1", otherwise it outputs a "0". The second sense operation happens after word line voltage raise up to Vccp, which is Vcc+Vt threshold.

Before the second sensing, the multiplex has been reconfigured so that the accessed bit line connected to In+ and reference bit line connected to In−. If the memory cell stores a Vcc, the ASA will output a "1", if the memory cell stores a "Vcc/2" the ASA will output a "0". In this process, three different voltages can be read out at two stages.

Since there are only three output states at two sensing operations, some additional bits can be used so that 4 possibilities at two read operations can be obtained. Some restore circuits are adhered with ASA, so that the write back operation can be done at the same time with the sense operation.

The write operation can also be realized by using the restore circuit and ASA and reduce the circuit complexity of the write process.

Since the first sense operation can start after word line reaches Vcc/2 and can output data immediately after the first read operation, so the speed is faster than conventional DRAM at the first read operation. The second sense operation starts after word line reaches Vccp and then ASA generates the data, also the write back circuit and ASA restore the data back memory cells at this stage. The second sense operation is also faster than conventional DRAM since word line does not need to rise from 0 to Vccp but from Vcc/2 to Vcc. Both latch based sense amplifier and differential based sense amplifier can be used in this scheme.

The power consumption at the sense operations of this three-level DRAM is smaller than conventional DRAM. There are two reasons: 1. The two consecutive sense operations access the same physical memory cells, thus the bit line pair will only be precharged once. 2. If a memory cell stores a voltage level of Vcc/2, the voltage of bit line pair will not change and therefore do not need much pre charge current for bit line pair capacitor.

BRIEF INTRODUCTION TO THE DRAWINGS

The present invention will be described by way of example with reference to the following drawings in which.

DETAILED DESCRITION OF THE INVENTION

In order to store more than one bit in a single memory cell capacitor, the cell capacitor must store more than 2 voltage levels, specifically, for storing 1.5 bits per cell, cell capacitor should store 3 voltage levels such as GROUND (0), Vcc/2 any Power supply (Vcc) as shown in FIG. 1.

The reference bit line and reference memory cell capacitor are always charge to vcc/2. Before a sensing operation happens, the bit line capacitor voltage charged to Vcc/2, then word line voltage increases to Vccp, depending on stored voltage, the bit line voltage may increase, decrease, or unchanged. At the first sense operation, the accessed bit line connected to the input In− of ASA, at the second sense operation, the accessed bit line connected to the input In+ of ASA. This configuration is controlled by a multiplex whose input is Sel from an exclusive or gate as shown in FIG. 3B. The En signal to the XOR gate tells multiplex which bit line, A or B, is the accessed bit line, so the multiplex can configure the connection correctly. The XOR gate is shared by every bit line in a memory array. At the first sense operation, the ASA try to detect if a0 voltage stored in the accessed memory cell, in this case, the word line does not need to charge up to Vccp but only to vcc/2. If a "0" is stored, the bit line voltage will decrease, since it connects to In−, the ASA can output a "1". If a "Vcc/2" is stored, the bit line voltage will not change, and because the design of ASA makes input In− has some advantage over input In+, the ASA will output a "0" at the first sensing operation, similarly a "Vcc" will also output a "0". The design of ASA is to make the transistors size different, so one input is overpower another input if they are at the same voltage level.

Figure 3A:
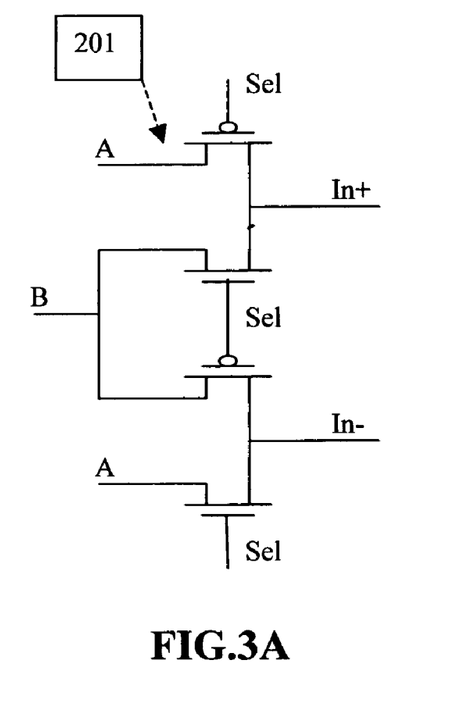
FIG. 3A is a schematic diagram illustrating how the multiplex configured, FIG. 3B show an exclusive or gate that control the multiplex.
Figure 3B:
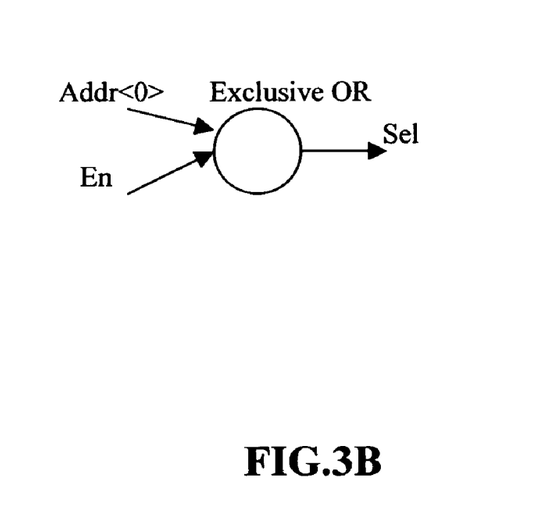
Figure 5:
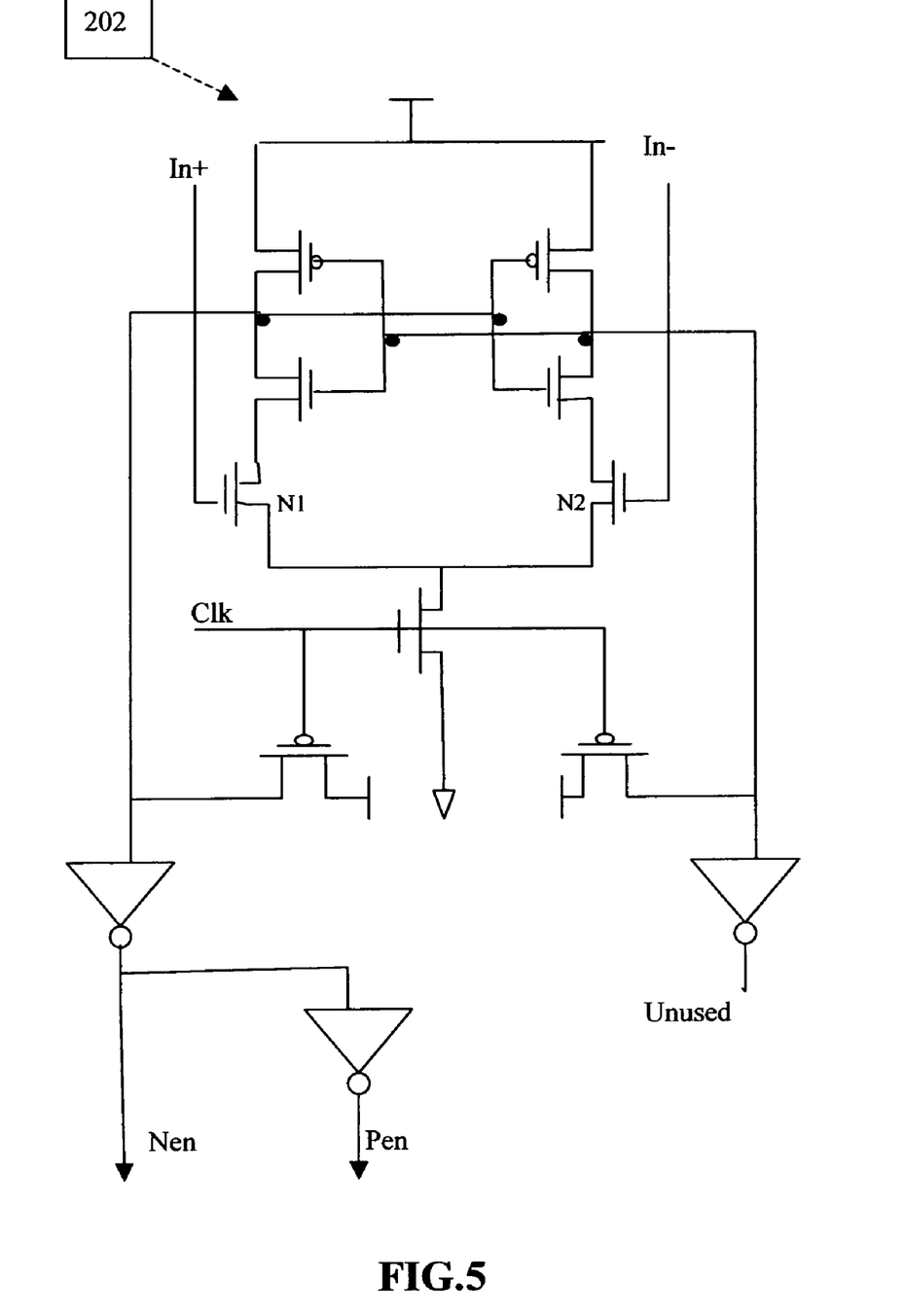
FIG. 5 is a schematic diagram illustrating how a differential based asymmetrical sense amplifier connect and configured.

If ASA output Nen is high, the Pen goes low as shown in FIG. 5, so the In− is discharge to 0 and In+ is charged to Vcc as shown in FIG. 3. Since at this time In− connected to the accessed bit line, a0 voltage will be written back to the accessed bit line.

After the first sense operation, the word line rise up to Vccp and the multiplex switches the connection between bit line pair and ASA inputs. If ASA outputs a "1" at the first sense operation, the accessed bit line is discharged to 0 and will make the second operation outputs a "0" because the accessed bit line connects to In+ at the second sense operation. Since accessed bit line is "0" after the second sense operations, the voltage level of 0 can be written back to memory cell.

If ASA outputs "0" at the first sense operation, both reference and accessed bit line voltage will not be charged or discharged. Then at the second sense operation, if the memory cell stores a "Vcc", the accessed bit line voltage increase, the ASA will output a "1" since accessed bit line connects to In+. If a "Vcc/2" stored, the accessed bit line voltage will not change and because the input In− has some advantage over input In+, the ASA will generate a "0". If ASA outputs a "1" at the second stage, the In+ charged up to Vcc and In− discharged to 0, and because the In+ connects to accessed bit line, a voltage level of Vcc can be write back to memory cell.

Figure 3C:
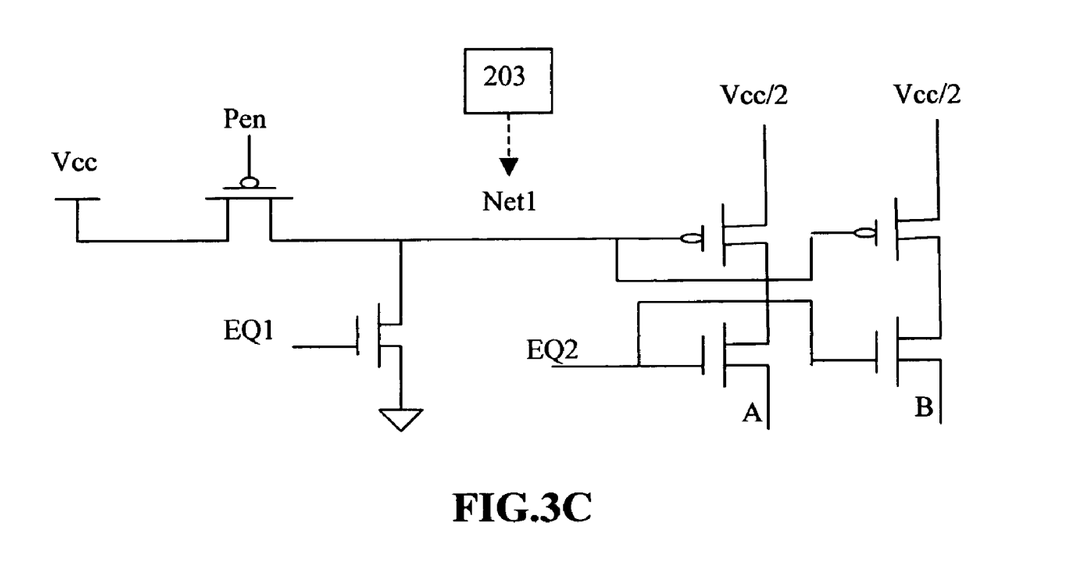
FIG. 3C is a schematic diagram illustrating the design of a Vcc/2 charge circuit.
Figure 4:
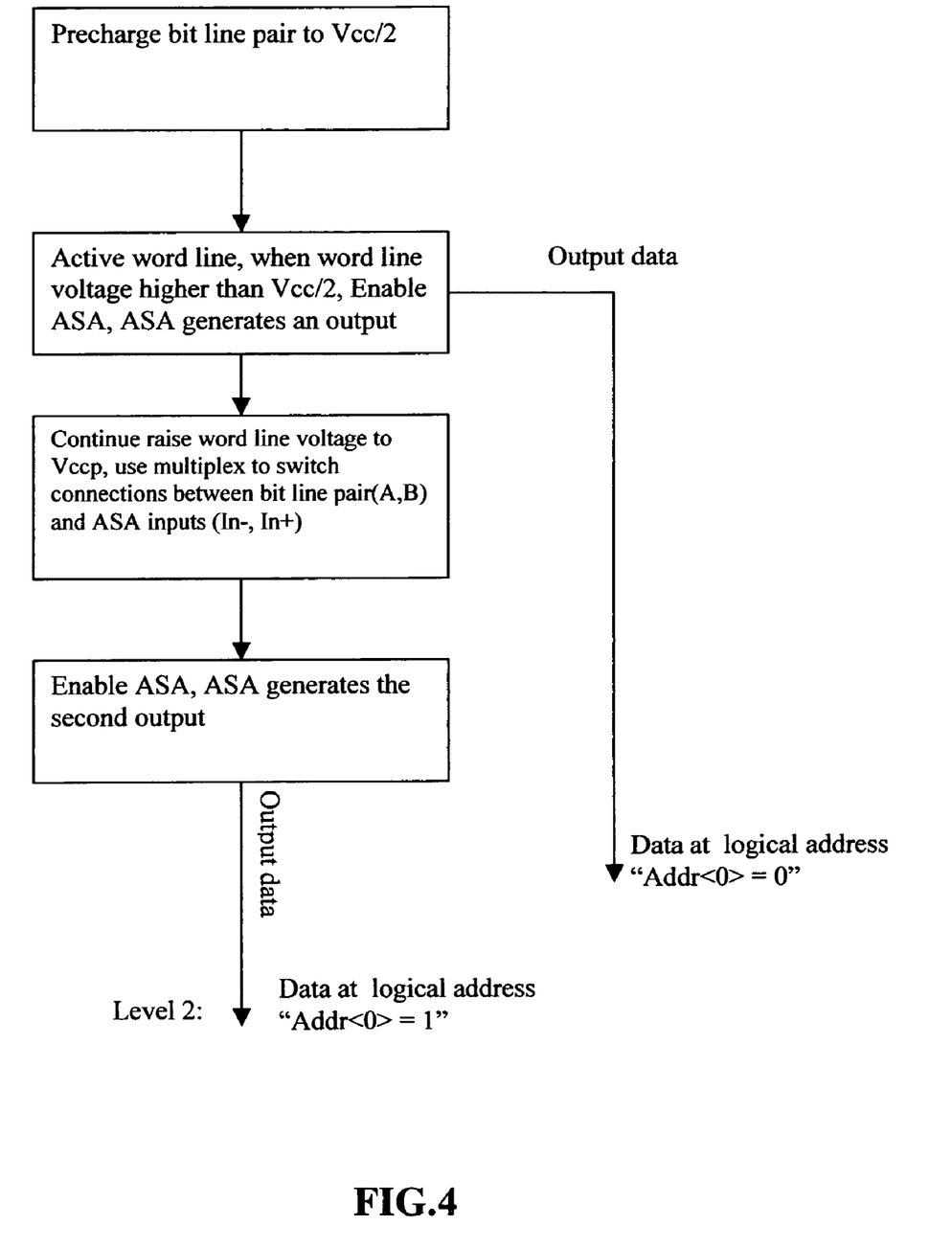
FIG. 4 is a flowchart diagram illustrating two sensing operations according to an embodiment of the present invention.

If stored voltage is Vcc/2, the ASA will output "0" at both sense operations. A write back circuit is provided for restoring voltage level of Vcc/2. As shown in FIG. 3C, a dynamic circuit is used to detect whether the ASA outputs a "1"

through these two sense operations, if no any "1" output, both bit lines will be set to Vcc/2, thus the voltage level of Vcc/2 can be restored.

In FIG. 3C, EQ1 is a normal equilibration signal for all bit lines, EQ2 is a special equilibration signal for the write back of Vcc/2. EQ1 is high in the memory array standby state and goes low in the read/write/refresh operations, EQ2 is normally low but only goes high for a moment after the second sensing. First EQ1 is high at the standby state, the node Net1 goes to low, then at the sense stage, EQ1 goes low and Net1 is floating. If ASA generate a "1", the Pen is "0", Net1 will charge up to Vcc, if ASA does not generate a "1", Net1 will keep low by the parasitic capacitors of the transistors in FIG. 3C. After two sense operations, EQ2 goes high and can set bit lines to Vcc/2 if Net1 is still0 at that time.

Figure 8A:
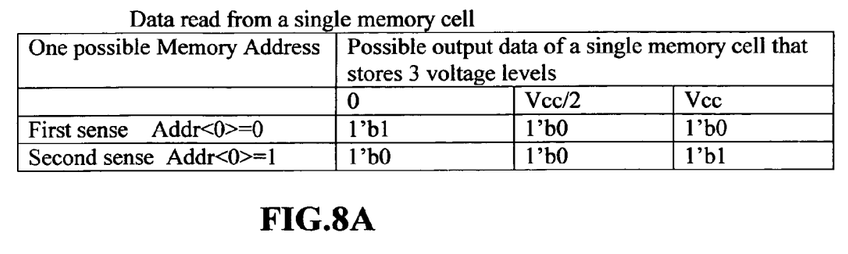
FIG. 8A is the data read from a single 3 level memory cell.

After two sense operations, three different possible voltage levels can be read out, the corresponding output data is shown in FIG. 8A.

Figure 2:
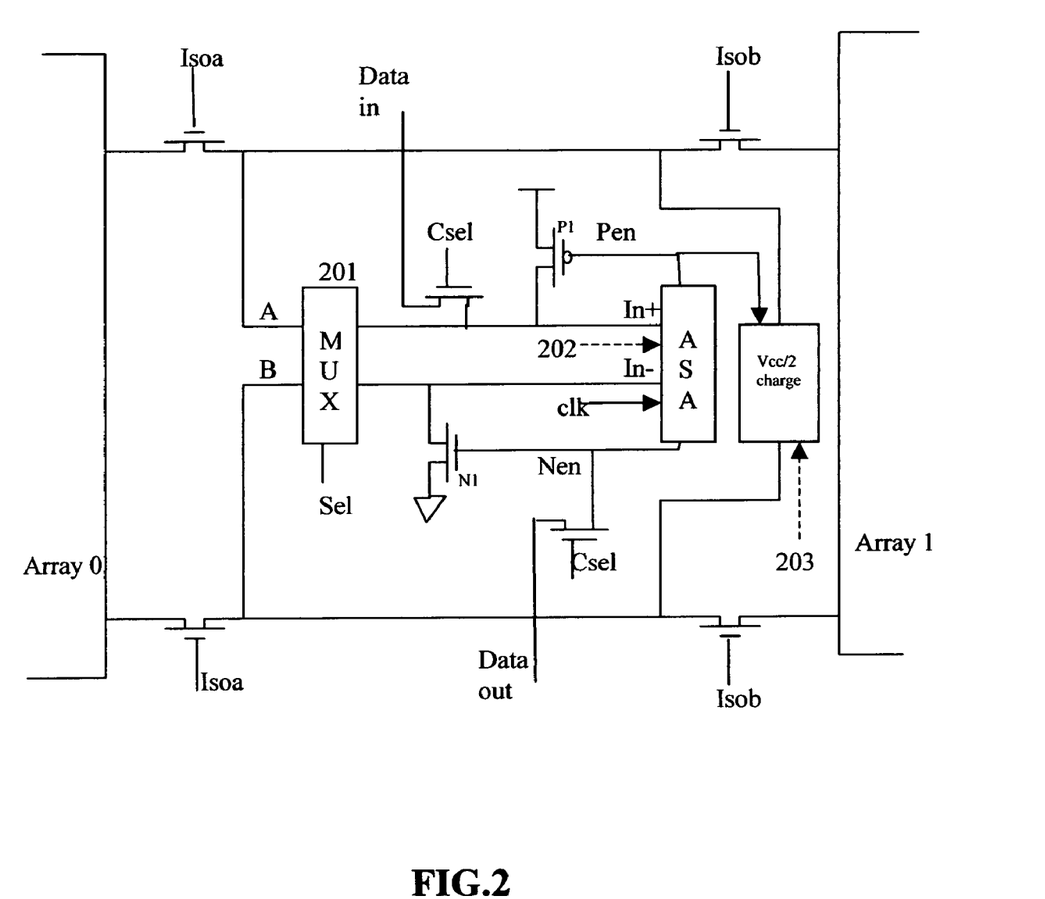
FIG. 2 is a diagram illustrating the connection between ASA and bit line pair, it also illustrate a read/write and restore circuits for current scheme.

A column select signal Csel controls a n-type transistor, when Csel is high, data can be read out, as shown in FIG. 2.

The data write process, also uses the same principal as read process. The difference is that Csel signal is high before the ASA enabled, so the In+ is controlled easily by the input data. For example, if a 1'b1 need to write at logical address addr0=0 and a 1'b0need to write at logical address addr0=1, send 1'b1 at the first write operation, then send 1'b0 at the second write operation.

For the asymmetrical sense amplifier, ASA, both latch based sense amplifier and differential based sense amplifier can be used. One differential based sense amplifier is shown in FIG. 5. The input In– has some advantage over input In+, the W/L ratio of transistor N2 is higher than the ratio of N1, so that unless the voltage level of In+ is some degree higher than In–, the ASAs output Nen is always zero. The W/L ratio difference between N1 and N2 depends on the noise environment, the process variation and other circuit considerations.

Figure 6:
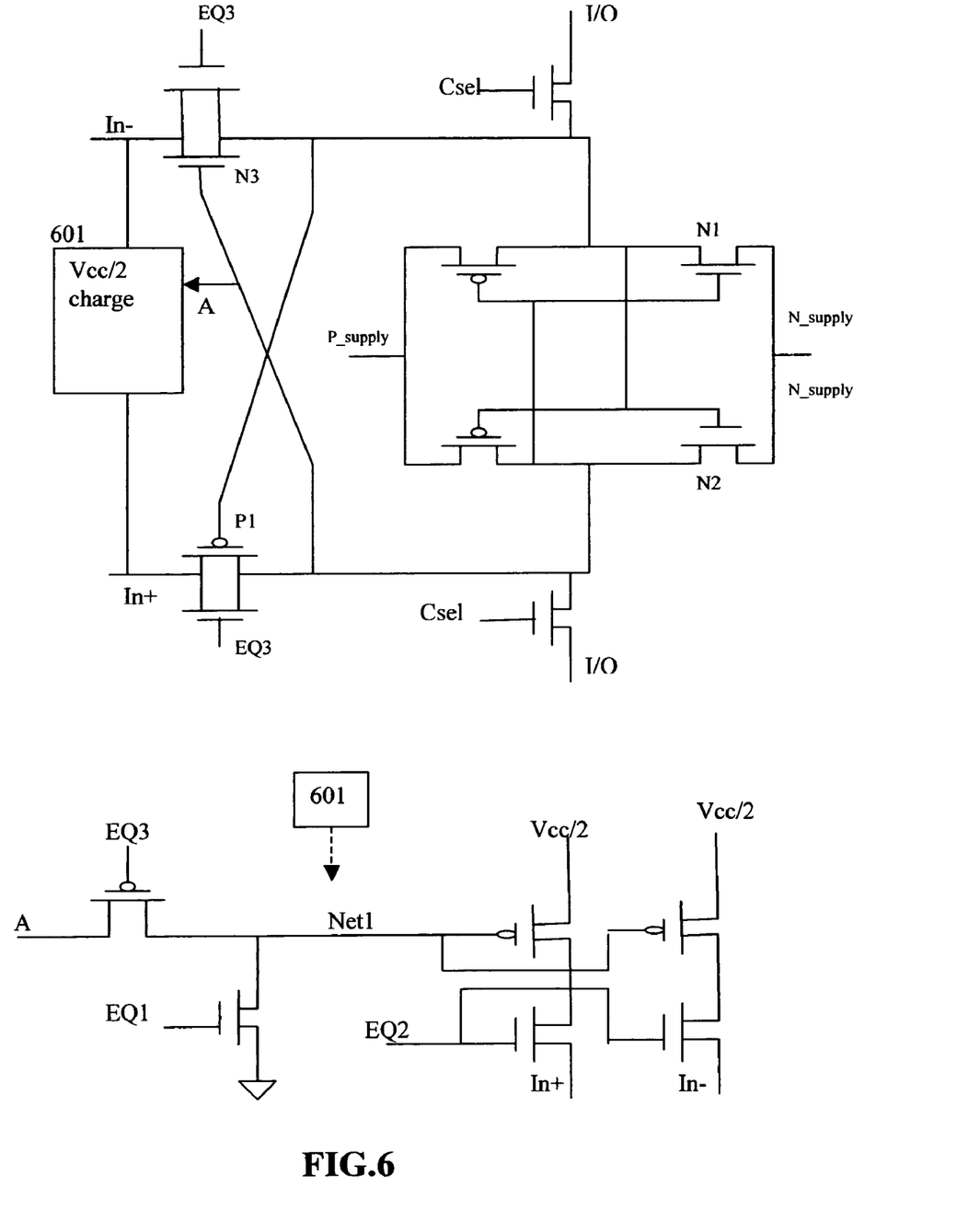
FIG. 6 is a schematic diagram illustrating how a latched based asymmetrical sense amplifier connect and configured.

A latch based sense amplifier is shown in FIG. 6, the W/L ratio of transistor N1 and N2 is different and in that way In– has some advantage over In+. An additional signal EQ3 is used for the sense operation, when EQ3 is high, the bit line pair connects to the coupled latch, then EQ3 goes low and P_supply, N_supply active, the latch detects and amplifiers the data, if N1 turns on and N2 turns off, transistors N3 and P1 turns on, thus the bit line pair can be discharged or charged. If N3 and P1 never turn on at the two sense operations, the Vcc/2 charged circuit will set the bit line pair voltage to Vcc/2.

If a latch based sense amplifier used, the charge/discharge transistors P1 and N1 in FIG. 2 will be deleted.

As shown in FIG. 8A, a single memory cell that stores 3 voltage levels can have two addresses, for example 8 bit address 8'b00000000 and 8'b00000001, and thus doubles the memory density. However, for 3 level memory cell, since there are only three possible outputs at two logical addresses: {1'b1, 1'b0}, {1'b0, 1'b0}, {1'b0, 1'b1}but no {1'b1, 1'b1}. To get a faster read speed some encoding/decoding code bits or parity check bits can be adhered to memory data bits and thus can generate four possible outputs from a single memory cell.

Figure 8B:
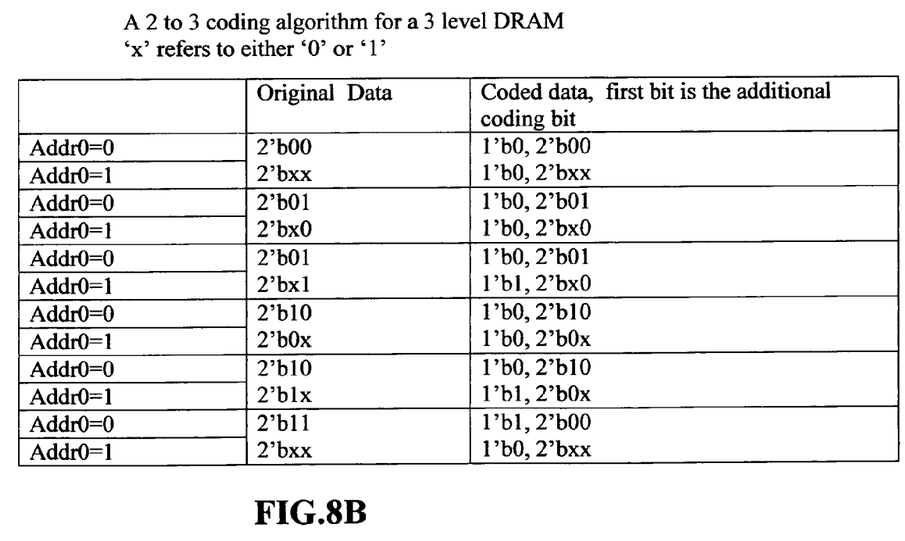
FIG. 8B is a 2 to 3 coding algorithm for a 3 level DRAM.

There are lots of coding algorithms to solve this problem, one possible coding structure for 3-level memory cell is to add one more additional memory cell to two memory data cells, so a 25% (1¾) memory array size can be saved. One of the coding algorithms is shown in FIG. 8B If the data at Addr0=0 is 1, the following data at Addr0=1 will always be 0, if a "1" is need at Addr0=1, the data at Addr0=0 must be "0" or additional bit need to represent data at Addr0=1.

This ⅔ coding algorithm is very easy for hardware implementation, but 25% (¼) memory array size saving is not its limit. Another coding algorithm and method have been designed in this invention, by adding 3 additional coding cells to 8 data cells, a 31% (1−11/16) memory array size saving is possible.

For an 8 bit data 8'bxxxxxxxx at logical address Addr0=0, if it has five or more "1", it is inverted and thus has only three or less "1". The 3 coding cells are used as this: if the first additional cell output is "1", the 8 bit data has been inverted so the read out data need to be inverted back at logical address Addr0=0, if the first additional cell output is "0", the read out data don't need to invert. The other 2 additional cells has 9 states (3*3=9) and can represent the states at logical address Addr0=1 of the memory data cells that output "1" at Addr0=0. At most only three memory cells output "1" at Addr0=0.

If the 8 bit data 8'bxxxxxxxx at Addr0=0 has exact four "1", it does not need to invert and the additional 3 cells can be used as the following: these 3 cells have 27 states (3*3*3) and can represent the states at logical address Addr0=1 of the memory data cells that output "1" at Addr0=0. Only four memory cells output "1" at Addr0=0.

The 8 bit data at Addr0=0 tells the decoder where these "1" output memory cells exist so the additional coding memory cells can be used to decode the data at Addr0=1 of these "1" output memory cells.

An alternative coding approach can be fully software as computer program which also use additional bits for coding. So the encoding/decoding circuit is not need in the DRAM circuit but rather realized by computer program.

Figure 7:
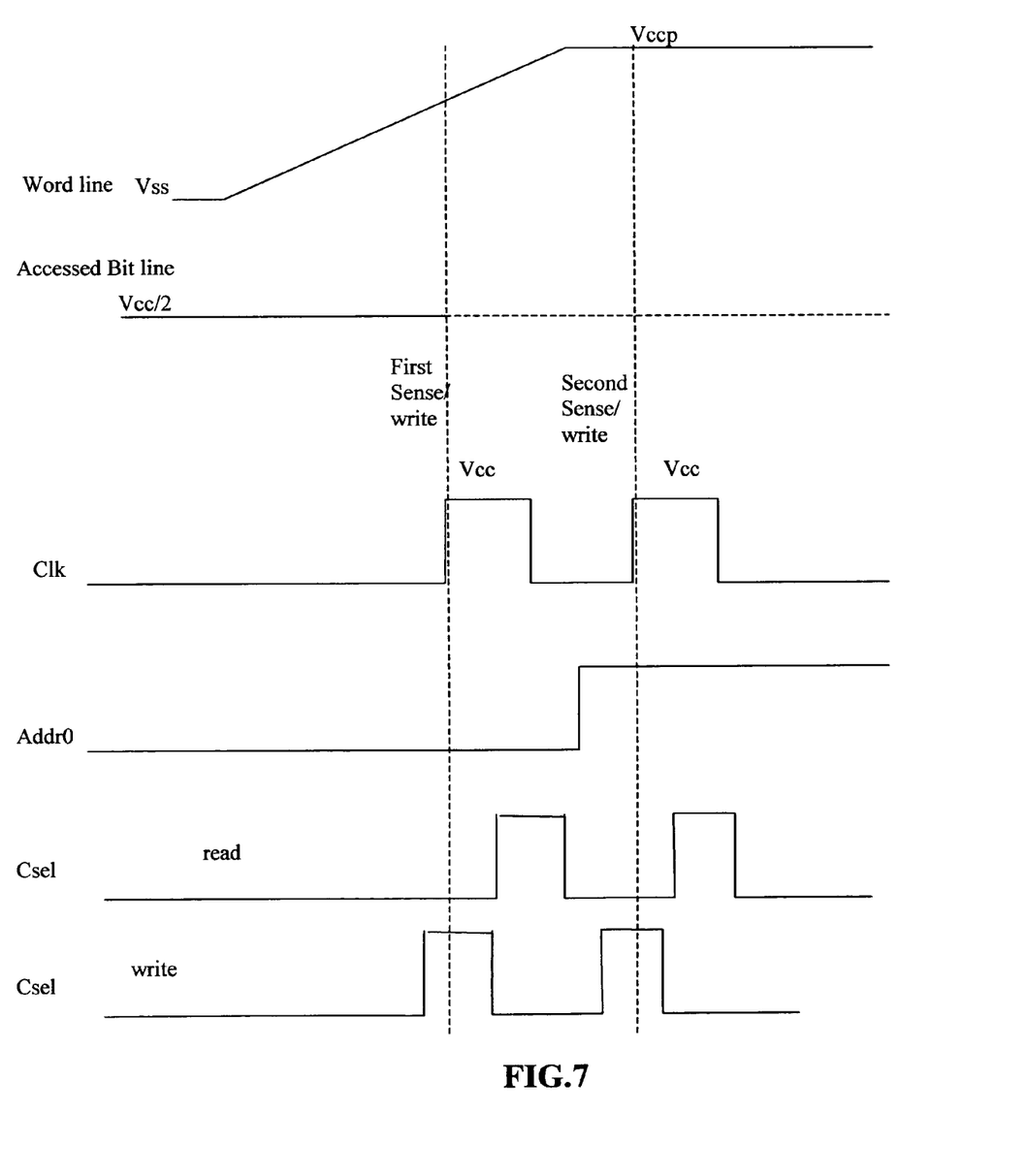
FIG. 7 illustrates a timing diagram of the schematic illustrated in FIG. 2.

FIG. 7 shows the timing relationship of different signal used in FIG. 2. For accessing a single memory cell, first access the data at logical address Addr0=0, then access the data at logical address Addr0=1. Clk is used to control when to enable and disable ASA, Csel is used to control when to read or write the data.

The power consumption at the sense operations of this three-level DRAM is smaller than conventional DRAM. There are two reasons: 1. every two sense operations only access the one memory cells, thus the bit line pair will only be precharged once. 2. If a a accessed memory cell stores Vcc/2, the voltage of bit line pair will not change and therefore do not need much pre charge current for bit line pair.

I claim:

1. A dynamic random access memory for storing three-level voltage in a single memory cell with high speed read and two addresses by using multiplex to switch the connection between bit line pair and asymmetrical sense amplifier inputs, the memory comprising:
    (a) a multiplex that controls and switches the connection between bit line pair and asymmetrical sense amplifier inputs at two sense/write operations;
    (b) the asymmetrical sense amplifier, which makes one input being stronger than the other input such that unless they have enough difference, the output state is constant and does not change;
    (c) additional coding memory bits, which combines with data memory bits to provide fast read operation; and
    (d) restore schemes to write back the 3 level voltages to the memory cells.

2. The dynamic random access memory defined in claim 1, said the asymmetrical sense amplifier is designed to have a voltage offset between the two inputs.

3. The dynamic random access memory defined in claim 1, said the read operation comprising the steps of
    (a) raising up word line voltage from0 to Vccp;

(b) asymmetrical sense amplifier is enabled when word line voltage reach Vcc/2 and Vccp;

(c) two consecutive data is read out at two different logical address from same physical address memory cells; and (d) additional coding bits are used to provide the additional state for three voltage level DRAM cells.

* * * * *